United States Patent
Li

(10) Patent No.: US 9,318,725 B2
(45) Date of Patent: Apr. 19, 2016

(54) MICROCAVITY OLED DEVICE WITH NARROW BAND PHOSPHORESCENT EMITTERS

(71) Applicant: Jian Li, Tempe, AZ (US)

(72) Inventor: Jian Li, Tempe, AZ (US)

(73) Assignee: Jian Li, Tempe, AZ (US)

( * ) Notice: Subject to any disclaimer, the term of this patent is extended or adjusted under 35 U.S.C. 154(b) by 31 days.

(21) Appl. No.: 14/380,719

(22) PCT Filed: Feb. 26, 2013

(86) PCT No.: PCT/US2013/027827
§ 371 (c)(1),
(2) Date: Aug. 23, 2014

(87) PCT Pub. No.: WO2013/130483
PCT Pub. Date: Sep. 6, 2013

(65) Prior Publication Data
US 2015/0008419 A1    Jan. 8, 2015

Related U.S. Application Data

(60) Provisional application No. 61/603,576, filed on Feb. 27, 2012.

(51) Int. Cl.
H01L 51/00 (2006.01)
H01L 51/52 (2006.01)
H01L 51/50 (2006.01)

(52) U.S. Cl.
CPC ........ H01L 51/5271 (2013.01); H01L 51/0087 (2013.01); H01L 51/5016 (2013.01); H01L 51/5024 (2013.01); H01L 51/5036 (2013.01); H01L 51/5206 (2013.01); H01L 51/5221 (2013.01); H01L 51/5265 (2013.01)

(58) Field of Classification Search
CPC ............ H01L 51/0087; H01L 51/5016; H01L 51/5024; H01L 51/5036; H01L 51/5206; H01L 51/5221; H01L 51/5265; H01L 51/5271
See application file for complete search history.

(56) References Cited

U.S. PATENT DOCUMENTS

| | | | | |
|---|---|---|---|---|
| 7,268,485 B2 * | 9/2007 | Tyan | .................... | H01L 51/5275 313/501 |
| 2005/0037232 A1 * | 2/2005 | Tyan | .................... | H01L 51/5265 428/690 |
| 2006/0066228 A1 * | 3/2006 | Antoniadis | ......... | H01L 51/5262 313/506 |

* cited by examiner

*Primary Examiner* — Whitney T Moore
*Assistant Examiner* — Joseph Galvin, III

(57) ABSTRACT

A microcavity organic light emitting diode (OLED) device is disclosed having a narrow-band phosphorescent emitter.

28 Claims, 2 Drawing Sheets

MICROCAVITY OLED DEVICE WITH NARROW BAND PHOSPHORESCENT EMITTERS

CROSS-REFERENCE TO RELATED APPLICATIONS

This application claims the benefit of U.S. Application No. 61/603,576, filed Feb. 27, 2012, which is hereby incorporated by reference in its entirety.

This application claims the benefit of PCT Application No. PCT/US2013/027827, filed Feb. 26, 2013, which is hereby incorporated by reference in its entirety.

STATEMENT OF GOVERNMENT SUPPORT

The present invention was made with financial support from the National Science Foundation under Career Grant No. 0748867. The U.S. government has certain rights in this invention.

BACKGROUND

1. Technical Field

The present disclosure relates to a microcavity organic light emitting diode (OLED) device comprising a narrow-band phosphorescent emitter.

2. Technical Background

Compounds capable of emitting light are ideally suited for use in a wide variety of applications, including optical and electro-optical devices, and as markers for bio-applications. Much research has been devoted to the discovery and optimization of organic and organometallic materials for use in such applications. Generally, research in this area aims to accomplish a number of goals, including improvements in emission efficiency, emission color purity as well as improvements in processing ability, among others.

Despite significant advances in research devoted to optical, electro-optical, and marker materials, existing materials have a number of disadvantages, including poor processing ability, inefficient emission, and less than ideal emission spectral bandwidth, among others. Thus, a need exists for new materials which exhibit improved performance in optical emitting applications.

During the past two decades, organic light emitting diode (OLED) devices have received a special interest, especially in the field of electronics. However, these applications require high performance materials. To improve the efficiency of a light emitting device, a maximum extraction of light is required. Thus, a need exists for new materials and methods of integration of such materials in the device settings for enhancing light emission. This need and other needs are satisfied by the present invention.

SUMMARY

The present invention relates to a microcavity organic light emitting diode (OLED) device comprising a narrow-band phosphorescent emitter.

In one aspect the present invention can be represented by the figures, for example, FIG. 2.

In one aspect, the present disclosure provides a microcavity narrow band organic light emitting diode (OLED) device having enhanced light emission.

In another aspect, the present disclosure provides a microcavity narrow band organic light emitting diode (OLED) device, comprising a) a substrate; b) a microcavity having a selected cavity length defined over one substrate by, in sequence, a dielectric mirror made with a quarter wave stack (QWS), a metallic transmissive electrode, an organic electroluminescent (EL) layer comprising of a hole transporting layer (HTL), an emissive layer (EML), an electron transporting layer (ETL), and a metal electrode, wherein the QWS comprises of a defined number of alternating high refractive index and low refractive index QWS pairs and wherein a maximum reflectivity of QWS mirrors is provided by a selection of dielectric materials; wherein one metallic electrode layer is light transmissive and the second metal electrode layer is substantially opaque and reflective; wherein the organic electroluminescent layer (EL) can comprise at least one host material selected from the class of aryl amines and aryl-substituted carbazole compounds, aryl substituted oxadiazoles, aryl-substituted triazoles, aryl substituted phenanthrolines and metal quinoxolates, or a combination thereof, and at least one phosphorescent emitter material dispersed in at least one host material and selected from the class of phosphorescent dyes, so that one of red, green, or blue lights is generated in the EML layer, wherein the position of the EML to the metal electrode layer that is opaque and reflective is defined; wherein the selected cavity length of the microcavity OLED device is tuned to provide a resonance condition for emission of one of red, green, or blue light through the light transmissive electrode layer and having the improved light extraction efficiency; and, wherein the light extraction efficiency of the device is tuned by adjusting the distance between a metallic transmissive electrode and the metal electrode layer that is opaque and reflective, and the selected cavity length by adjusting a thickness of the light transmissive electrode layer and a thickness of the organic electroluminescent layer (EL), or a combination thereof.

In another aspect, the present disclosure provides a microcavity narrow band organic light emitting diode (OLED) device, comprising a) a substrate; b) a metallic electrode, an organic electroluminescent (EL) layer comprising of a hole injection layer (HIL), a hole transporting layer (HTL), an emissive layer (EML), an electron transporting layer (ETL), a electron injection layer (EIL) and a metal electrode, wherein one metallic electrode layer is light transmissive and the second metal electrode layer is substantially opaque and reflective, wherein the organic electroluminescent layer (EL) can comprise at least one host material selected from the class of aryl amines and aryl-substituted carbazole compounds, aryl substituted oxadiazoles, aryl-subsituted triazoles, aryl substituted phenanthrolines and metal quinoxolates, or a combination thereof, and at least one phosphorescent emitter material dispersed in at least one host material and selected from the class of phosphorescent dyes, so that one of red, green, or blue lights is generated in the EML layer, wherein the position of the EML to the metal electrode layer that is opaque and reflective is defined; wherein the selected cavity length of the microcavity OLED device is tuned to provide a resonance condition for emission of one of red, green, or blue light through the light transmissive electrode layer and having the improved light extraction efficiency; and, wherein the light extraction efficiency of the device is tuned by adjusting the distance between a metallic transmissive electrode and the metal electrode layer that is opaque and reflective, and the selected cavity length by adjusting a thickness of the light transmissive electrode layer and a thickness of the organic electroluminescent layer (EL), or a combination thereof.

BRIEF DESCRIPTION OF THE FIGURES

The accompanying figures, which are incorporated in and constitute a part of this specification, illustrate several aspects and together with the description serve to explain the principles of the invention.

Figure 1:
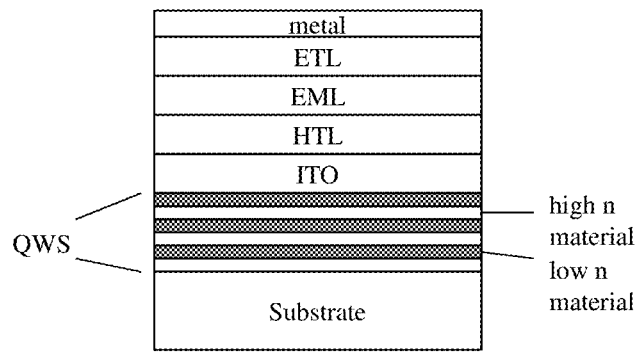
FIG. 1 illustrates a general scheme for a microcavity OLED with a combination of DBR and reflective metal electrode, in accordance with various aspects of the present disclosure.

Additional aspects of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION

The present invention can be understood more readily by reference to the following detailed description of the invention.

Before the present compounds, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

As used in the specification and the appended claims, the singular forms "a," "an" and "the" include plural referents unless the context clearly dictates otherwise. Thus, for example, reference to "a component" includes mixtures of two or more components.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "optional" or "optionally" means that the subsequently described event or circumstance can or can not occur, and that the description includes instances where said event or circumstance occurs and instances where it does not.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, optionally substituted alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

The terms "amine" or "amino" as used herein are represented by the formula $NA^1A^2A^3$, where $A^1$, $A^2$, and $A^3$ can be, independently, hydrogen or optionally substituted alkyl, cycloalkyl, alkenyl, cycloalkenyl, alkynyl, cycloalkynyl, aryl, or heteroaryl group as described herein.

The term "halide" as used herein refers to the halogens fluorine, chlorine, bromine, and iodine.

The term "hydroxyl" as used herein is represented by the formula —OH.

The term "nitro" as used herein is represented by the formula —$NO_2$.

The term "nitrile" as used herein is represented by the formula —CN.

The term "thiol" as used herein is represented by the formula —SH.

Disclosed are the components to be used to prepare the compositions of the invention as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds can not be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific embodiment or combination of embodiments of the methods of the invention.

As used herein, the term "transparent" refers to a conductive phase-layer, an absorption-reducing layer, or a substrate, and denotes an optical transmission of more than 90% of light directed perpendicularly at a surface of such element.

As used herein, the term "light transmissive" refers to the metallic electrode through which light is to be transmitted and denotes and optical transmission of between 20% and 90% of light directed perpendicularly at a surface of such metallic electrode.

As used herein, the term "reflective" and "opaque" refer to the metallic electrode through which light is not to be transmitted, and denotes a mirror-like optical reflectivity and an optical transmission of less than 5% of light directed perpendicularly at a surface of such metallic electrode.

As briefly described above, the present invention is directed to a microcavity light emitting diode (OLED) device with narrow band phosphorescent emitters.

In one aspect, and while not wishing to be bound by theory, a microcavity device can redistribute the photon density in such a way that only photons with wavelengths corresponding to the allowed cavity modes are emitted. Microcavity structures has been demonstrated to enhance light output of an OLED device and improve the color purity.

In one aspect, the microcavity narrow band OLED device disclosed herein can provide enhanced light extraction and improved power efficiency. In another aspect, the microcavity OLED device disclosed here is comprised of a substrate and a microcavity having a selected cavity length, which is equal to or slightly longer than integer multiple of half-value of the peak emission wavelength of a narrow band phosphorescent emitter. In yet another aspect, the device's microcavity includes a quarter wave stack (QWS) mirror disposed over the substrate and a metal top electrode and a metallic light transmissive bottom electrode layer, wherein the spacing between the top metal electrode and the closest high refractive index material layer define the cavity length. In another aspect an organic electroluminescent (EL) layer comprising of a hole transporting layer (HTL), an emissive layer (EML), and an electron transporting layer (ETL) is disposed between the bottom and top electrodes.

In one aspect, the microcavity narrow band OLED device disclosed herein can provide enhanced light extraction and improved power efficiency, wherein the cavity length is equal to or slightly longer than half-value of the peak emission wavelength of a narrow band phosphorescent emitter.

In another aspect, the microcavity narrow band OLED device disclosed herein can provide enhanced light extraction and improved power efficiency, wherein the cavity length is equal to or slightly longer than the peak emission wavelength of a narrow band phosphorescent emitter.

FIG. 1 illustrates an exemplary cross-sectional view of a microcavity narrow band OLED device disclosed therein. The microcavity narrow band OLED device includes a substrate 101; a quarter wave stack (QWS) 102; a metallic light transmissive electrode represented herein by, but not limited to, indium tin oxide (ITO) 103; an organic electroluminescent layer 104 that comprises a hole transporting layer (HTL) 10, an emissive layer (EML) 20, and an electron transporting layer (ETL) 30; and a top metal electrode 105.

In one aspect the substrate of microcavity narrow band OLED device can comprise a glass. In another aspect the substrate can comprise a plastic substrate comprising polyethylene naphthalate (PEN). In another aspect the substrate can comprise a metal foil, including but not limited to, a stainless steel.

In one aspect the QWS mirror, also called a distributed Bragg reflector (DBR) or Bragg mirror, is a mirror structure comprising an alternating sequence of layers of high refractive index and low refractive index materials that are substantially optically transparent at the design wavelength, such that they absorb no or very little light. The DBR is designed to provide a high reflectivity at a desired (or design) wavelength. Without wishing to be bound by theory, the design wavelength is typically chosen to be close to the peak emission wavelength of an emissive material, such as EML 20, or close to the emission wavelength at the desired temperature of operation of the device. For example, if the emission wavelength of an emissive material has a peak at 500 nm, then the design wavelength for the DBR can be 480-500 nm.

In another aspect of the invention, the optical layer thickness of each layer in the DBR corresponds to one-quarter of the wavelength for which the mirror is designed, wherein the wavelength is taken to be the wavelength within the material (that is, the wavelength of the light, as measured in free space, divided by the refractive index of the material). As one skilled in art would appreciate, if the peak free space emission wavelength of the (design wavelength) is $\lambda_0$ and the refractive indices of the mirror materials are $n_1$ and $n_2$, then the layer (quarter-wavelength) thicknesses for the two DBR materials are given by $t_1 = \lambda_0/4n_1$ and $t_2 = \lambda_0/4n_2$, respectively. In some embodiments, the thickness of each layer can be chosen to be an odd integer multiple of the quarter-wavelength thickness.

In yet another aspect, a maximum reflectivity can be achieved for a given wavelength and a number of layer pairs given an appropriate selection of dielectric materials. Increasing the number of layers in the DBR generally increases the reflectivity of the mirror.

In one aspect, QWS mirrors in the inventive device comprise alternating high and low refractive index materials comprising dielectric materials.

In yet another aspect, low refractive index dielectric materials can include, but are not limited to $SiO_2$, $SiN_x$, LiF, or a combination thereof, wherein the index of refraction is from about 1 to about 2.

In one aspect, higher refractive index dielectric materials can include, but are not limited to $TiO_2$, $TaO_2$, amorphous Si, or a combination thereof, wherein the index of refraction of these materials is from about 2 to about 3.5.

In another aspect, QWS mirrors comprise optically transparent semiconductor materials including II-VI materials and III-V nitride materials. An example of a II-VI Bragg Stack is described by Klembt et al., in "High-reflectivity II-VI-based distributed Bragg reflectors for the blue-violet spectral range", Appl. Phys. Lett. 99, 151101 92011), incorporated herein by reference. Examples of semiconductor Nitride DBRs are described by Ng et al., in "Distributed Bragg reflectors based on AlN/GaN multilayers", Appl. Phys. Lett., Vol. 74, No. 7, pp. 1036-1038, 1999 and by Eljarrat et al., in "(V)EELS Characterization of InAlN/GaN Distributed Bragg Reflectors" 2011, J. Phys. Conf. Ser. 326-12-14, both of which are incorporated herein by reference for the purpose of disclosing exemplary materials and design for DBR devices.

In another aspect, QWS mirrors comprise organic materials, for example, as described by Jeong et al, in "Flexible Microcavity Organic Light-Emitting Diodes with Wide-Band Organic Distributed Bragg Reflector", Jap. J. of Appl. Phys., Vol. 45, No. 28, 2006, pp. L737-L739, which is incorporated herein by reference.

In other aspects, the mirror may be a hybrid structures, incorporating dielectric, metal, and organic materials, for example, as described by Lin et al., in "Influences of resonant wavelengths on performances of microcavity organic light-emitting devices", App. Phys. Lett., 90, 071111, 2007, which is incorporated herein by reference. For example, a mirror comprising the dielectric LiF, the metal Al and the organic material Alq3 can be used.

In yet another aspect, QWS mirrors can comprise any combination of the above listed materials.

In another aspect of the invention, a second DBR can be placed on the opposite side of the EML. In some examples, the mirror can be a simple dielectric/metal/organic structure, but all mirror types previously mentioned can also be used.

One of ordinary skill in the art can appreciate that the material selection for both the bottom metallic light transmissive electrode and the top metal electrode that opaque and reflective can be significant in determining the device properties. One of skill in the art, in possession of this disclosure, could readily select appropriate materials for each electrode.

In one aspect, an electrode can comprise one of more metals, such as, for example, Ag, Au, Al, or alloys and/or combinations thereof. In one aspect, an alloy can be defined as having at least 50 atomic percent of at least one metal. In another aspect, an electrode can be opaque and/or reflective. In another aspect, the use of such metals for electrodes can provide increased luminance.

In one aspect, the metallic light transmissive layer can comprise one or more oxides, nitrides, sulfides, or a combination thereof. In another aspect, the metallic light transmissive layer can comprise indium tin oxide (ITO), zinc tin oxide (ZTO), tin oxide ($SnO_x$), indium oxide ($InO_x$), molybdenum oxide ($MoO_x$), tellurium oxide ($TeO_x$), antimony oxide ($SbO_x$), nickel oxide ($NiO_x$), zinc oxide ($ZnO_x$), titanium nitride ($TiN_x$), or a combination thereof.

In one aspect, the thickness of a light transmissive electrode can be limited. In one aspect, too thin a layer does not provide a significant microcavity effect and in yet another aspect too thick a layer reduces the luminance output. In one aspect, the thickness of a light transmissive electrode can be from 20 nm to about 200 nm.

In one aspect, top metal electrode can be a cathode. In another aspect, the bottom light transmissive electrode can be an anode.

In one aspect, the microcavity narrow band OLED device comprises an organic electroluminescent layer (EL) comprising at least one host material and one phosphorescent emitter material. In another aspect, the host material for an organic electroluminescent layer can comprise an aryl amine, an aryl substituted carbazole, or a combination thereof. In another aspect, the at least one phosphorescent emitter material can comprise a phosphorescent dye.

In another aspect, the host material can comprise at least one organic host material having an energy of its lowest triplet excited states that is at least about equal to or greater than that of the phosphorescent emitter material.

In another aspect, suitable host materials can comprise of 4,4'-N,N'-dicarbazole-biphenyl (CBP) and 2,6-bis(N-carbazolyl)pyridine (26mCPy). In another aspect, host materials can comprise aryl-substituted oxadiazoles, aryl-substituted triazoles, aryl-substituted phenanthrolines, metal quinoxolates, or combinations thereof.

In another aspect, an organic host material can comprise at least one hole-transporting layer (HTL) and at least one electron transporting layer (ETL). In yet another aspect, the EL can be oriented so that the HTLs are closer to the anode and ETLs are closer to the cathode.

In one aspect the HTLs can comprise any suitable conductor of holes. Various exemplary aspects of hole conductors for HTLs can comprise 4-4'-Bis[N-(1-naphthyl)-N-phenylamino]-biphenyl (NPB), di-(4-N,N-ditolyl-amino-phenyl) cyclohexane (TAPC), 4,4',4"-tris {N-(3-methylphenyl)-N-phenylamino}triphenylamine (m-MTDATA), conducting polyaniline (Pani), polyethylenedioxythiophene-polystyrenesulfonate (PEDOT:PSS), thiophenes, metal-base or metal-free phthalocyanines, and many other suitable materials that will be known to those of ordinary skill in the art.

In yet another aspect, ETLs can comprise tris(8-hydroxyquinoline)aluminum (Alq3), poly(phenylene vinylene) (PPV) and its derivatives, polyfluorenes, or 2,8-bis(diphenylphosphoryl)-dibenzothiophene (PO15), 1,3-bis(3,5-dipyrid-3-yl-phenyl)benzene (BmPyPB), (2-(4-biphenyl)-5-(4-tert-butylphenyl)-1,3,4-oxadiazol) (PBD) or derivatives thereof, or combinations thereof.

In one aspect, the EML can include at least one phosphorescent emitter where electroluminescence is produced as a result of an electron-hole pair recombination. One relationship for choosing a phosphorescent emitter can be a comparison of the bandgap potential which is defined as the energy difference between the highest occupied molecular orbital (HOMO) and the lowest unoccupied molecular orbital of the molecule (LUMO). For an efficient energy transfer from the host to the phosphorescent emitter, it can be beneficial for the band gap energy level of the phosphorescent emitter to be smaller than that of the host material.

In one aspect, the inventive microcavity OLED device comprises an organic electroluminescent layer comprising a four coordination complex structure to improve the thermal and electrochemical stability, comprising at least one bridging legend to ensure high triplet energy of emitting ligands, at least one ligand to improve hole-carrying stabilities and at least one ligand to improve electron carrying capabilities.

In another aspect, the emission spectrum of any of the phosphorescent emitters of the present disclosure can be tuned to a desired and/or customized spectrum. In another aspect, the complexes disclosed herein can provide a narrow bandwidth, enabling their use in the microcavity OLEDs devices.

In yet another aspect, the microcavity OLED device disclosed herein comprises a phosphorescent emitter material having a full-width-at-half-maximum (FWHM) emission spectrum of from about 5 nm to about 40 nm.

In yet another aspect the microcavity OLED device disclosed herein comprises the composition of the phosphorescent emitter comprising general formula:

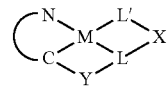

where (N^C) represents the emitting portion of the ligand, (LXL') represents an ancillary portion of the ligand, which may be linked, or not linked, M represents one or more of platinum, palladium, rhodium, iridium, silver, gold and copper. Y represents a linking motif that connects (N^C) to (LXL') while disrupting the conjugation between them, wherein N can be chosen from the following group:

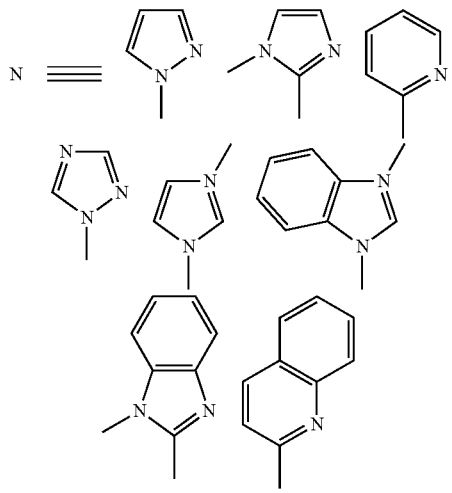

For any of the structures recited herein, unless specifically stated to the contrary, various symbols and/or abbreviations are used wherein: M represents platinum, palladium, rhodium, iridium, silver, gold and copper or a combination thereof, where each of $Ar_1$, $Ar_2$, $Ar_3$, and $Ar_4$, if present, independently represent an aromatic ring or heterocyclic group which can be substituted or unsubstituted; where each $X_n$ can be coordinated to a platinum, or a palladium, or a rhodium, or an iridium, or a silver, or a gold, or a copper atom, and can independently represent a carbon and/or a nitrogen atom, wherein $Ar_5$ can represent an aromatic ring, a heterocyclic group, or a combination thereof, where $Ar_6$ can represent an aromatic ring, a heterocyclic group, a combination thereof, or can be absent; where each $A_n$ can independently represent a linking atom, such as, for example, nitrogen, carbon, boron, phosphorus, silicon, or a combination thereof, and wherein each $A_n$ can optionally be substituted, where each $b_n$ can optionally be present or absent, and if present can independently represent oxygen, sulfur, nitrogen, carbon, boron, phosphorus, silicon, or a combination thereof.

Also, for any of the structures recited herein, $R_n$ can represent $R_1$-$R_{10}$, where each R can independently represent a hydrogen atom, an alkyl group, a haloalkyl group, an aralkyl group, an alkenyl group, an alkynyl group, an aryl group, an amino group, a mono- or di-alkylamino group, a mono- or diaryl amino group, an alkoxy group, an aryloxy group, a heteroaryloxy group, an alkoxycarbonyl group, an acyloxy group, an acylamino group, an alkoxycarbonylamino group, an aryloxycarbonylamino group, a sulfonylamino group, a sulfamoyl group, a carbamoyl group, an alkylthio group, a sulfinyl group, an ureido group, a phosphoramide group, a hydroxyl group, a mercapto group, a halogen atom, a cyano group, a sulfo group, a carboxyl group, a nitro group, a hydrzino group, a substituted silyl group, a polymerizable group, or a combination thereof; wherein if a plurality of R's are present (e.g., $R_n$), n can be from about 0 to about 4, and wherein each R can be the same or different from any other R, and wherein U, if present, can be oxygen, sulfur, or N—$R_n$.

In another aspect the microcavity narrow band OLED device comprises a phosphorescent emitter comprising one or more of the formulas

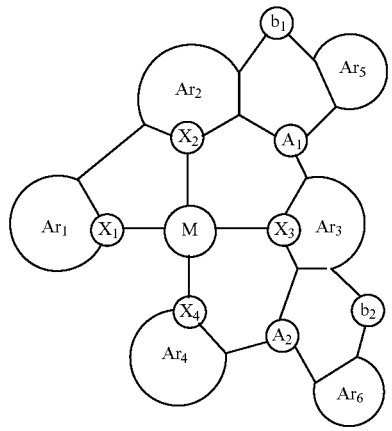

where M represents platinum, palladium, rhodium, iridium, silver, gold and copper or a combination thereof, where each of $Ar_1$, $Ar_2$, $Ar_3$ and $Ar_4$ independently represent an aromatic ring or heterocyclic group which can be substituted or unsubstituted; where each $X_n$ can be coordinated to a platinum and/or palladium atom, and can independently represent a carbon and/or a nitrogen atom, wherein $Ar_5$ can represent an aromatic ring, a heterocyclic group, or a combination thereof, where $Ar_6$ can represent an aromatic ring, a heterocyclic group, a combination thereof, or can be absent; where each $A_n$ can independently represent a linking atom, such as, for example, nitrogen, carbon, boron, phosphorus, silicon, or a combination thereof, and wherein each $A_n$ can optionally be substituted, where each $b_n$ can optionally be present or absent, and if present can independently represent oxygen, sulfur, nitrogen, carbon, boron, phosphorus, silicon, or a combination thereof, and wherein each $b_n$ can optionally be substituted.

In yet another aspect, the microcavity narrow band OLED device comprises a phosphorescent emitter comprising

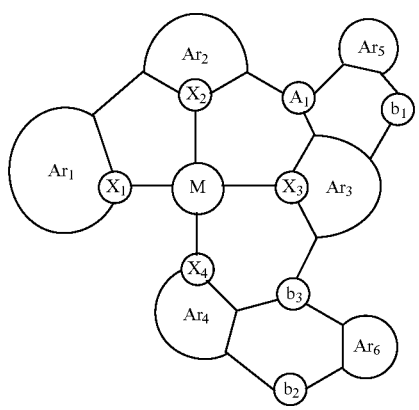

where M represents platinum, palladium, rhodium, iridium, silver, gold and copper or a combination thereof, where each of $Ar_1$, $Ar_2$, $Ar_3$, and $Ar_4$ independently represent an aromatic ring or heterocyclic group which can be substituted or unsubstituted; where each $X_n$ can be coordinated to a platinum and/or palladium atom, and can independently represent a carbon and/or a nitrogen atom, wherein $Ar_5$ can represent an aromatic ring, a heterocyclic group, or a combination thereof, where $Ar_6$ can represent an aromatic ring, a heterocyclic group, a combination thereof, or can be absent; where each $A_n$ can independently represent a linking atom, such as, for example, nitrogen, carbon, boron, phosphorus, silicon, or a combination thereof, and wherein each $A_n$ can optionally be substituted, where each $b_n$ can optionally be present or absent, and if present can independently represent oxygen, sulfur, nitrogen, carbon, boron, phosphorus, silicon, or a combination thereof, and wherein each $b_n$ can optionally be substituted.

The emission (and absorption) profile of the compounds can be tuned by varying the structure of the ligand surrounding the metal center. For example, compounds having a ligand with electron withdrawing substituents will generally exhibit different optical properties, including emission and absorption, than compounds having a ligand with electron donating substituents. Generally, a chemical structural change affects the electronic structure of the compound, which thereby affects the absorption and emission of the compound. Thus, the compounds of the present invention can be tailored or tuned to a specific application that desires a particular emission or absorption characteristic.

In one aspect,

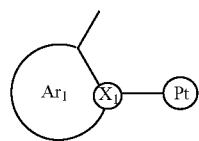

can comprise one or more of the following:

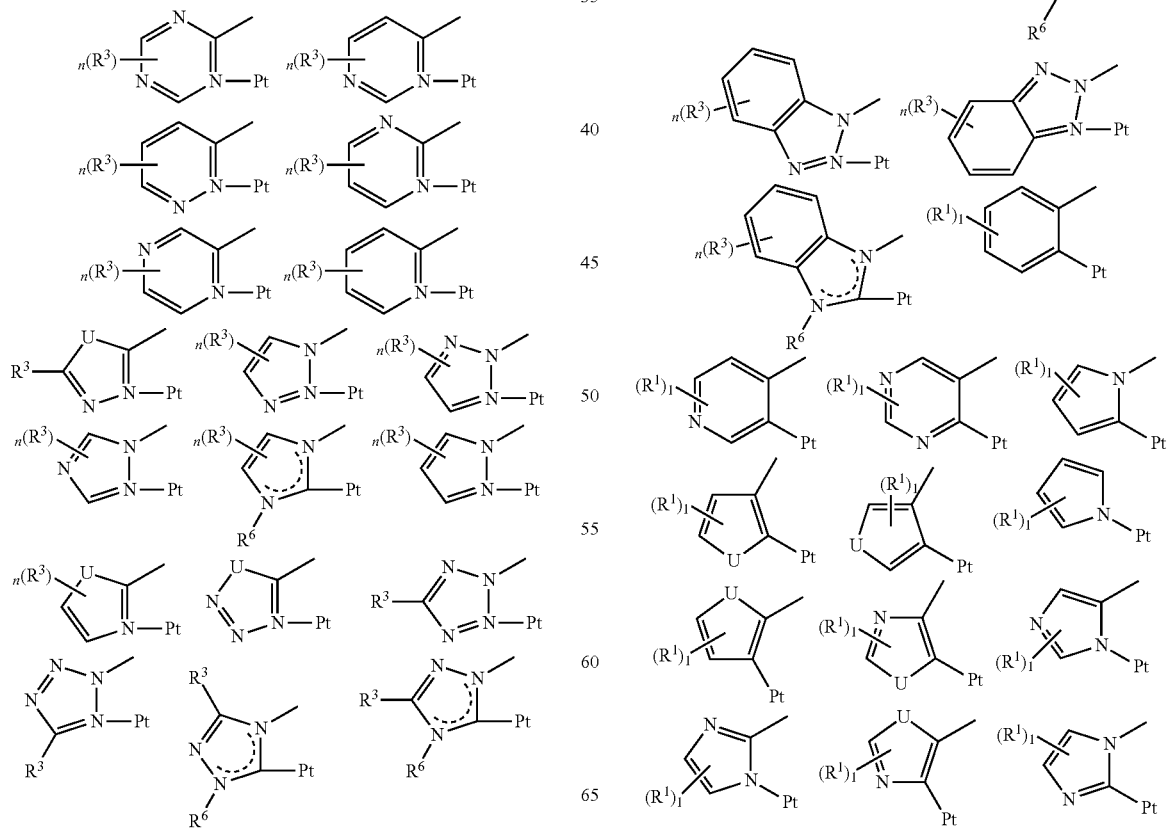

-continued
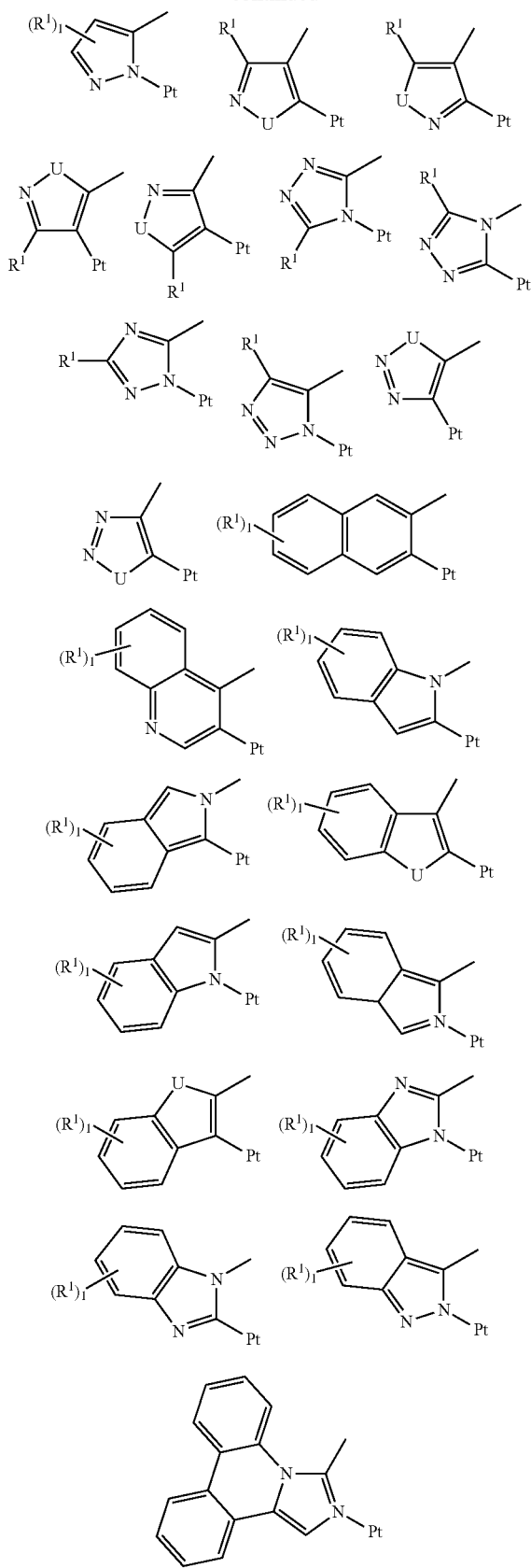
or a combination thereof.
In another aspect,
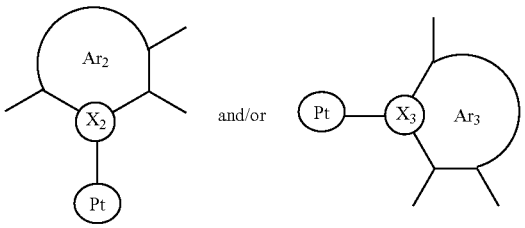
can each independently represent one or more of the following:
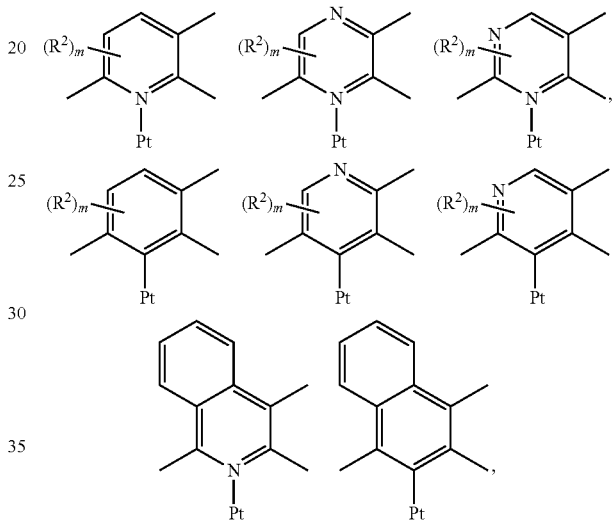
or a combination thereof.
In another aspect, each
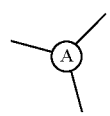
can independently represent one or more of the following:
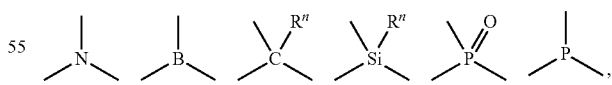
or a combination thereof.
In another aspect, each
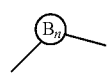

can independently represent one or more of the following:
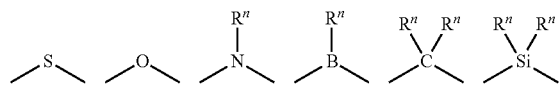
null or a combination thereof.
In another aspect,
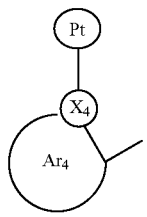
can represent one or more of the following:
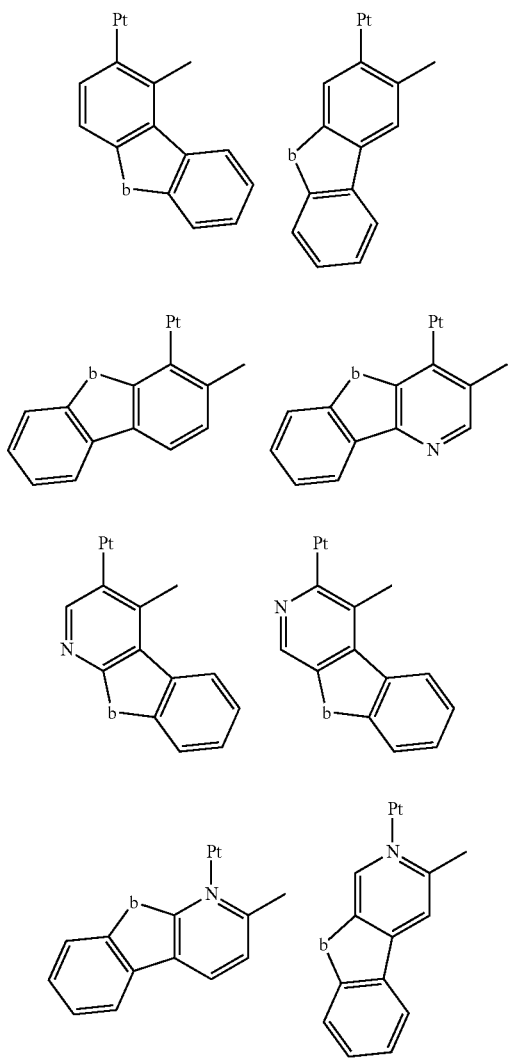
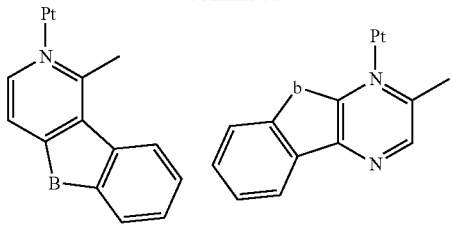
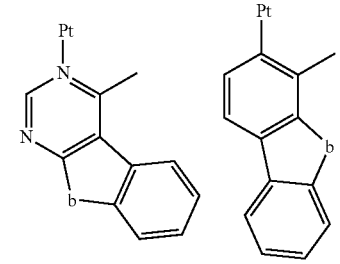
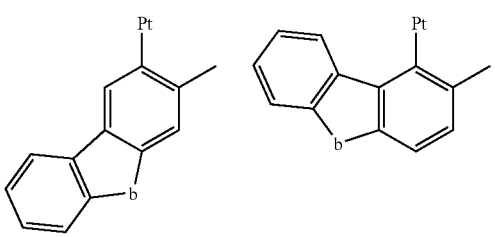
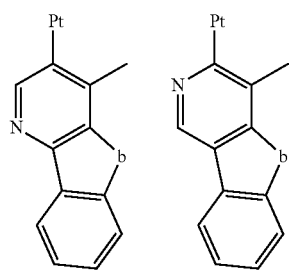
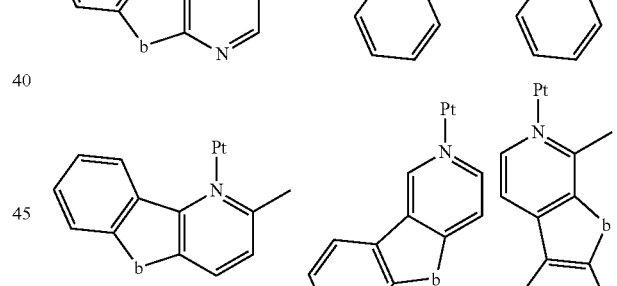
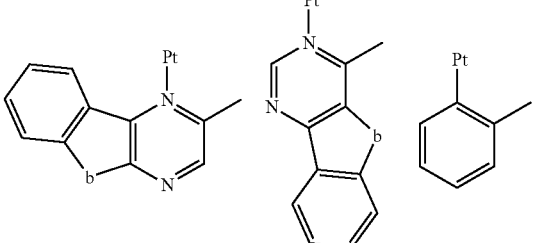
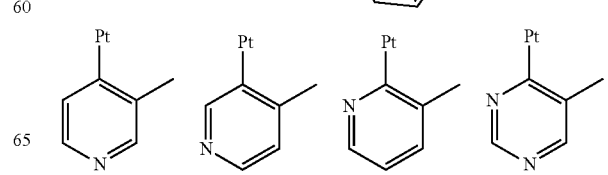

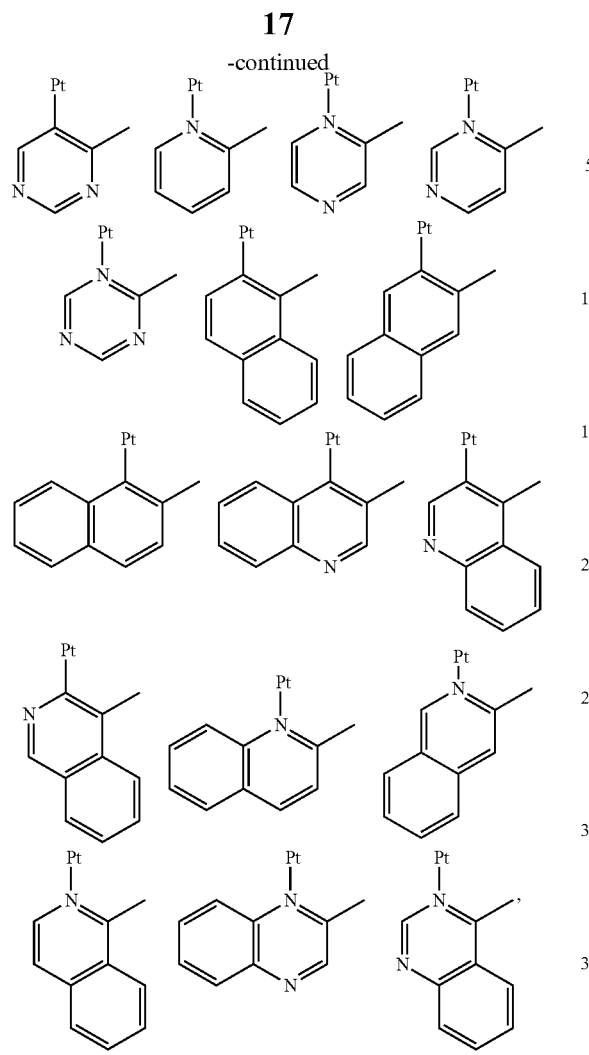
or a combination thereof.
In another aspect, each of
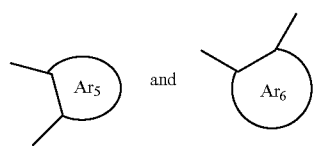
each represent one or more of the following:
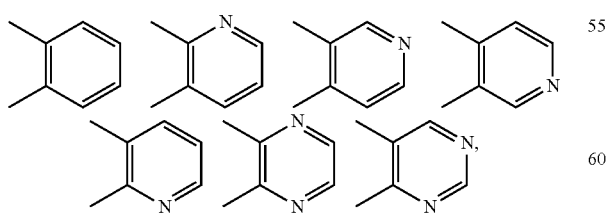
or a combination thereof.
In other aspects, the inventive composition can comprise any one or more of the following specific examples:
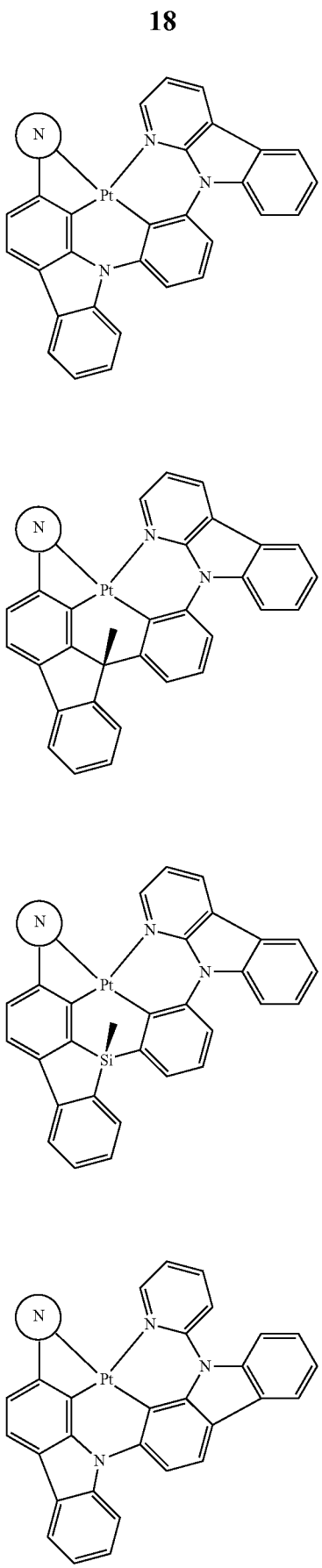

-continued

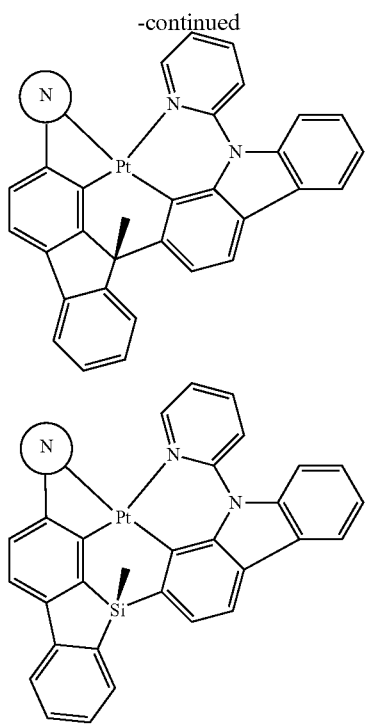

wherein

can be chosen from the following group

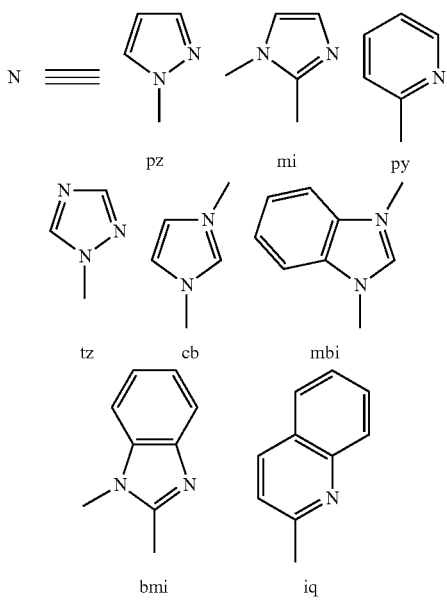

or a combination thereof.

It should be understood that the specific exemplary compositions recited herein are intended to be exemplary and not limiting.

In one aspect the concentration of the phosphorescent emitter in the host materials can be from about 1% to about 100%.

In another aspect the thickness of the EML can be from about 1 nm to about 150 nm.

Figure 2:
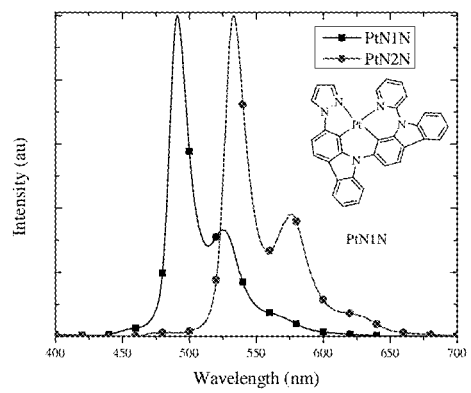
FIG. 2 illustrates the emission spectra of the compound Pt-N1N (inset) and Pt-N2N at room temperature, in accordance with various aspects of the present disclosure.

In one aspect, the use of narrow band phosphorescent emitters in microcavity devices can result in a reduction in photon loss as compared to other materials. In another aspect, the combination of narrow band phosphorescent emitters with microcavity settings can result in a directional light output enhancement and can reduce and/or eliminate the need for reflectors. FIG. 2 illustrates the room temperature emission spectra of exemplary PtN1N and PtN2N compounds.

While not wishing to be bound by theory, spontaneous emission is a consequence of a coupling between an emitting dipole and a photon field at the dipole location. In one aspect, controlling the vacuum photon field can be achieved using a resonator and the spontaneous emission rate can be enhanced by placing the dipole at the maximum field position. In a cavity device, the field density of states can be determined by the mirror reflectivity and the cavity length L. Therefore, high reflectivity mirrors and small cavities can, in one aspect, be desirable to achieve strong radiative emission. The theoretical emission spectrum in the forward direction can be calculated by the following equation based on classical optics:

$$|E_C(\lambda)|^2 = \frac{(1-R_2)\left[1+R_1+2(R_1)^{0.5}\cos\left(\frac{4\pi x}{\lambda}\right)\right]}{1+R_1 R_2 - 2(R_1 R_2)^{0.5}\cos\left(\frac{4\pi x}{\lambda}\right)}|E_{nc}(\lambda)|^2$$

where λ is the emission wavelength, x is the effective distance of the emitting layer from the metal mirror, R1 and R2 are the reflectivities of the metal mirror and dielectric mirror, respectively, L is the total optical length of the microcavity device, and $E_c(\lambda)$ is the free-space spectrum.

In one aspect in the cavity device, the resonant wavelength is controlled by L, which can influence the shape and peak values of the EL spectra.

In one aspect, control of L can be done by adjusting the thickness of the organic layers and/or the metallic light transmissive electrode. To obtain an optimum output spectrum, it is desirable to keep the cavity length at the peak of the free space emission wavelength.

In one aspect, the light extraction efficiency of the device is tuned by adjusting the thickness of the light transmissive electrode layer and a thickness of the organic electroluminescent layer (EL), or a combination thereof.

In one aspect, wherein the white OLED device can be fabricated by coating the opposite side of blue emitting microcavity narrow band OLED device with green, yellow, orange, red phosphors or a combination thereof. An example of a white OLED based on a blue microcavity OLED is described by So et. al. "Down-Conversion White Organic Light-Emitting Diodes Using Microcavity Structure", Adv. Energy Mater. 2011, 1, 174-178, incorporated herein by reference.

Figure 4:
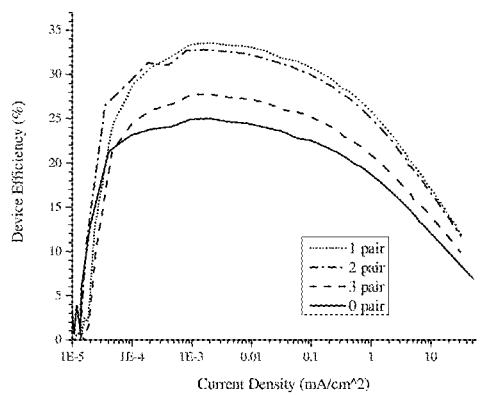
FIG. 4 illustrates the plot of device efficiency vs. current density for the device of glass/x pairs of (56 nm $Ta_2O_5$/83 nm $SiO_2$)/ITO/HATCN (10 nm)/NPD (40 nm)/TAPC (10 nm)/6% PtN1N:26mCPy (25 nm)/DPPS (10 nm)/BmPyPB (45 nm)/LiF (1 nm)/Al (100 nm), where x=0-3, in accordance with various aspects of the present disclosure.

FIG. 4 illustrates that PtN1N-based microcavity narrow band OLED devices have close to 40% enhancement in the device efficiency compared to the standard PtN1N-based OLED, where the cavity length is slightly longer than the peak emission wavelength of PtN1N (i.e. 496 nm).

Figure 5:
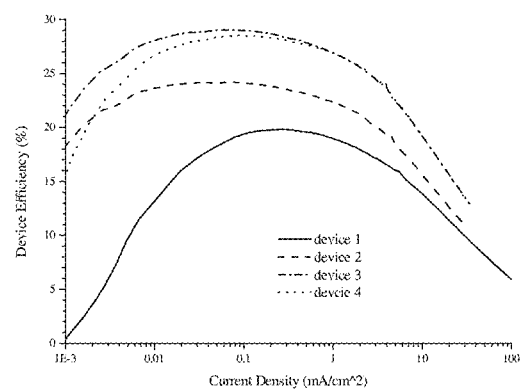
FIG. 5 illustrates the plot of device efficiency vs. current density for the device of glass/DBR/ITO/PEDOT:PSS (40 nm)/NPD (40 nm)/TAPC (10 nm)/8% PtN1N: 26mCPy (25 nm)/DPPS (10 nm)/BmPyPB (30 nm)/LiF (1 nm)/Al (100 nm), wherein DBR, device 1—none, device 2—56 nm $Ta_2O_5$, device 3—56 nm $Ta_2O_5$/83 nm $SiO_2$/56 nm $Ta_2O_5$, device 4—56 nm $Ta_2O_5$/83 nm $SiO_2$/56 nm $Ta_2O_5$/83 nm $SiO_2$/56 nm $Ta_2O_5$, in accordance with various aspects of the present disclosure.
Figure 6:
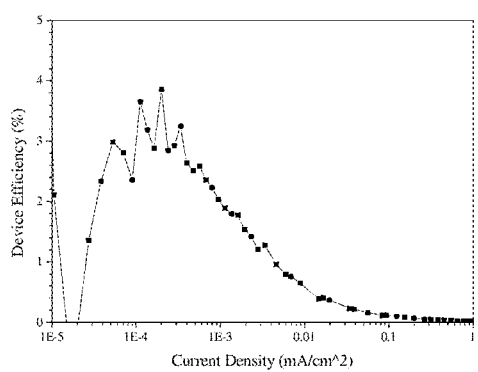
FIG. 6 illustrates the plot of device efficiency vs. current density for the device of glass/Ag (100 nm)/$MoO_3$ (10 nm)/NPD (40 nm)/TAPC (20 nm)/8% PtN1N:26mCPy (25 nm)/DPPS (40 nm)/LiF (1 nm)/Al (20 nm), in accordance with various aspects of the present disclosure.

FIG. 5 illustrates that PtN1N-based microcavity narrow band OLED devices have close to 50% enhancement in the device efficiency compared to the standard PtN1N-based OLED, where the cavity length is slightly longer than half-value of the peak emission wavelength of PtN1N (i.e. 248 nm).

Figure 3:
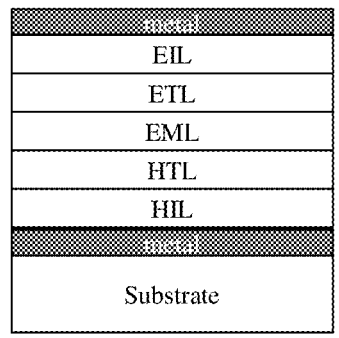
FIG. 3 illustrates a general scheme for a microcavity OLED with a pair of transmissive metallic electrode and reflective metal electrode, in accordance with various aspects of the present disclosure.

FIG. 3 illustrates an exemplary cross-sectional view of a microcavity narrow band OLED device disclosed therein. The microcavity narrow band OLED device includes a substrate 101; a bottom metal electrode 105; an organic electroluminescent layer 104 that comprises a hole injection layer (HIL) 40, a hole transporting layer (HTL) 10, an emissive layer (EML) 20, and an electron transporting layer (ETL) 30, an electron injection layer (EIL) 50; and a top metallic light transmissive electrode, 103.

In one aspect the substrate of microcavity narrow band OLED device can comprise a glass. In another aspect the substrate can comprise a plastic substrate comprising polyethylene naphthalate (PEN). In another aspect the substrate can comprise a metal foil, including but not limited to, a stainless steel.

In one aspect, an electrode can comprise one of more metals, such as, for example, Ag, Au, Al, or alloys and/or combinations thereof. In one aspect, an alloy can be defined as having at least 50 atomic percent of at least one metal. In another aspect, an electrode can be opaque and/or reflective. In another aspect, the use of such metals for electrodes can provide increased luminance.

In one aspect, the metallic light transmissive layer can comprise one or more oxides, nitrides, sulfides, Ag, Au, Al, or alloys and/or combinations thereof. In another aspect, the metallic light transmissive layer can comprise indium tin oxide (ITO), zinc tin oxide (ZTO), tin oxide ($SnO_x$), indium oxide ($InO_x$), molybdenum oxide ($MoO_x$) tellurium oxide ($TeO_x$), antimony oxide ($SbO_x$), nickel oxide ($NiO_x$), zinc oxide ($ZnO_x$), titanium nitride ($TiN_x$), or a combination thereof.

In one aspect, the thickness of a light transmissive electrode can be limited. In one aspect, too thin a layer does not provide a significant microcavity effect and in yet another aspect too thick a layer reduces the luminance output. In one aspect, the thickness of a light transmissive electrode can be from 20 nm to about 200 nm.

In one aspect, the bottom metal electrode can be a cathode. In another aspect, the top light transmissive electrode can be an anode.

In one aspect, the inventive microcavity OLED device comprises an organic electroluminescent layer comprising a four coordination complex structure to improve the thermal and electrochemical stability, comprising at least one bridging legend to ensure high triplet energy of emitting ligands, at least one ligand to improve hole-carrying stabilities and at least one ligand to improve electron carrying capabilities.

In another aspect, the emission spectrum of any of the phosphorescent emitters of the present disclosure can be tuned to a desired and/or customized spectrum. In another aspect, the complexes disclosed herein can provide a narrow bandwidth, enabling their use in the microcavity OLEDs devices.

In yet another aspect, the microcavity OLED device disclosed herein comprises a phosphorescent emitter material having a full-width-at-half-maximum (FWHM) emission spectrum of from about 5 nm to about 40 nm.

In yet another aspect the microcavity OLED device disclosed herein comprises the composition of the phosphorescent emitter comprising general formula:

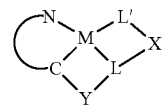

where (N^C) represents the emitting portion of the ligand, (LXL') represents an ancillary portion of the ligand, which may be linked, or not linked, M represents one or more of platinum, palladium, rhodium, iridium, silver, gold and copper. Y represents a linking motif that connects (N^C) to (LXL') while disrupting the conjugation between them, wherein N can be chosen from the following group:

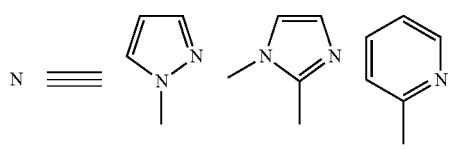

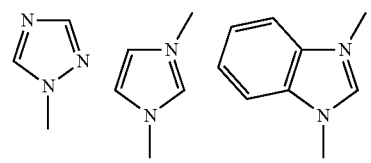

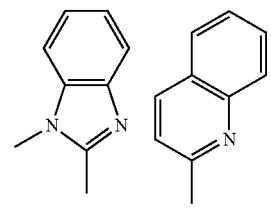

For any of the structures recited herein, unless specifically stated to the contrary, various symbols and/or abbreviations are used wherein: M represents platinum, palladium, rhodium, iridium, silver, gold and copper or a combination thereof, where each of $Ar_1$, $Ar_2$, $Ar_3$, and $Ar_4$, if present, independently represent an aromatic ring or heterocyclic group which can be substituted or unsubstituted; where each $X_n$ can be coordinated to a platinum, or a palladium, or a rhodium, or an iridium, or a silver, or a gold, or a copper atom, and can independently represent a carbon and/or a nitrogen atom, wherein $Ar_5$ can represent an aromatic ring, a heterocyclic group, or a combination thereof, where $Ar_6$ can represent an aromatic ring, a heterocyclic group, a combination thereof, or can be absent; where each $A_n$ can independently represent a linking atom, such as, for example, nitrogen, carbon, boron, phosphorus, silicon, or a combination thereof, and wherein each $A_n$ can optionally be substituted, where each $b_n$ can optionally be present or absent, and if present can independently represent oxygen, sulfur, nitrogen, carbon, boron, phosphorus, silicon, or a combination thereof.

Also, for any of the structures recited herein, $R_n$ can represent $R_1$-$R_{10}$, where each R can independently represent a hydrogen atom, an alkyl group, a haloalkyl group, an aralkyl group, an alkenyl group, an alkynyl group, an aryl group, an amino group, a mono- or di-alkylamino group, a mono- or diaryl amino group, an alkoxy group, an aryloxy group, a heteroaryloxy group, an alkoxycarbonyl group, an acyloxy group, an acylamino group, an alkoxycarbonylamino group, an aryloxycarbonylamino group, a sulfonylamino group, a sulfamoyl group, a carbamoyl group, an alkylthio group, a sulfinyl group, an ureido group, a phosphoramide group, a hydroxyl group, a mercapto group, a halogen atom, a cyano group, a sulfo group, a carboxyl group, a nitro group, a hydrzino group, a substituted silyl group, a polymerizable group, or a combination thereof; wherein if a plurality of R's are present (e.g., $R_n$), n can be from about 0 to about 4, and wherein each R can be the same or different from any other R, and wherein U, if present, can be oxygen, sulfur, or N—$R_n$.

In another aspect the microcavity narrow band OLED device comprises a phosphorescent emitter comprising one or more of the formulas

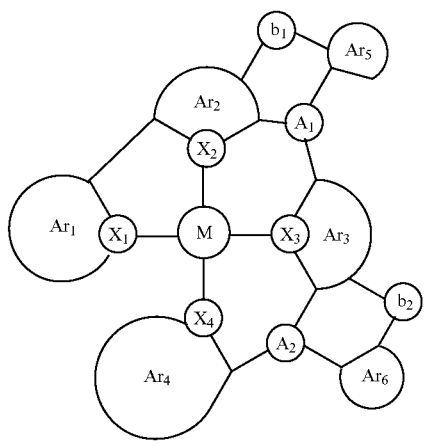

where M represents platinum, palladium, rhodium, iridium, silver, gold and copper or a combination thereof, where each of $Ar_1$, $Ar_2$, $Ar_3$ and $Ar_4$ independently represent an aromatic ring or heterocyclic group which can be substituted or unsubstituted; where each $X_n$ can be coordinated to a platinum and/or palladium atom, and can independently represent a carbon and/or a nitrogen atom, wherein $Ar_5$ can represent an aromatic ring, a heterocyclic group, or a combination thereof, where $Ar_6$ can represent an aromatic ring, a heterocyclic group, a combination thereof, or can be absent; where each $A_n$ can independently represent a linking atom, such as, for example, nitrogen, carbon, boron, phosphorus, silicon, or a combination thereof, and wherein each $A_n$ can optionally be substituted, where each $b_n$ can optionally be present or absent, and if present can independently represent oxygen, sulfur, nitrogen, carbon, boron, phosphorus, silicon, or a combination thereof, and wherein each $b_n$ can optionally be substituted.

In yet another aspect, the microcavity narrow band OLED device comprises a phosphorescent emitter comprising

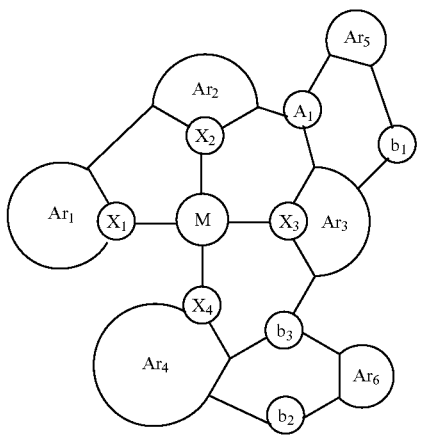

where M represents platinum, palladium, rhodium, iridium, silver, gold and copper or a combination thereof, where each of $Ar_1$, $Ar_2$, $Ar_3$, and $Ar_4$ independently represent an aromatic ring or heterocyclic group which can be substituted or unsubstituted; where each $X_n$ can be coordinated to a platinum and/or palladium atom, and can independently represent a carbon and/or a nitrogen atom, wherein $Ar_5$ can represent an aromatic ring, a heterocyclic group, or a combination thereof, where $Ar_6$ can represent an aromatic ring, a heterocyclic group, a combination thereof, or can be absent; where each $A_n$ can independently represent a linking atom, such as, for example, nitrogen, carbon, boron, phosphorus, silicon, or a combination thereof, and wherein each $A_n$ can optionally be substituted, where each $b_n$ can optionally be present or absent, and if present can independently represent oxygen, sulfur, nitrogen, carbon, boron, phosphorus, silicon, or a combination thereof, and wherein each $b_n$ can optionally be substituted.

The emission (and absorption) profile of the compounds can be tuned by varying the structure of the ligand surrounding the metal center. For example, compounds having a ligand with electron withdrawing substituents will generally exhibit different optical properties, including emission and absorption, than compounds having a ligand with electron donating substituents. Generally, a chemical structural change affects the electronic structure of the compound, which thereby affects the absorption and emission of the compound. Thus, the compounds of the present invention can be tailored or tuned to a specific application that desires a particular emission or absorption characteristic.

In one aspect,

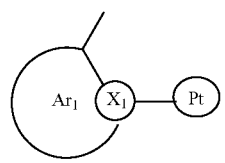

can comprise one or more of the following:

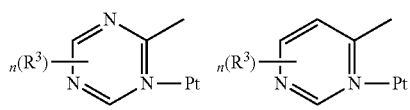

-continued
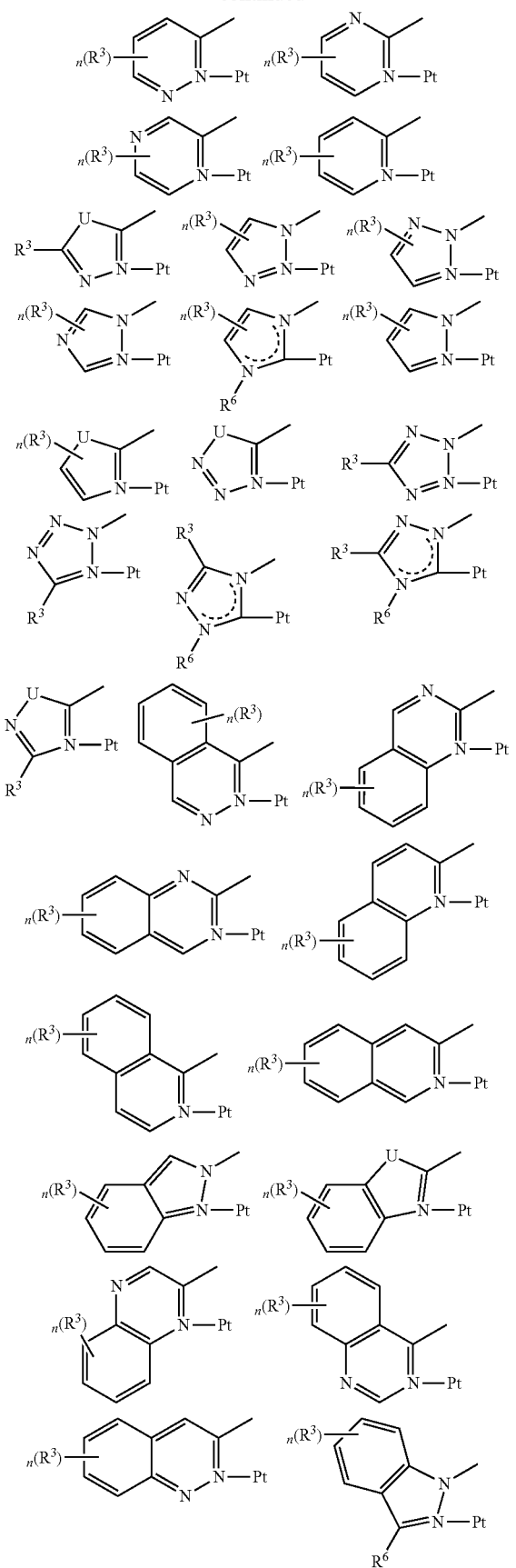
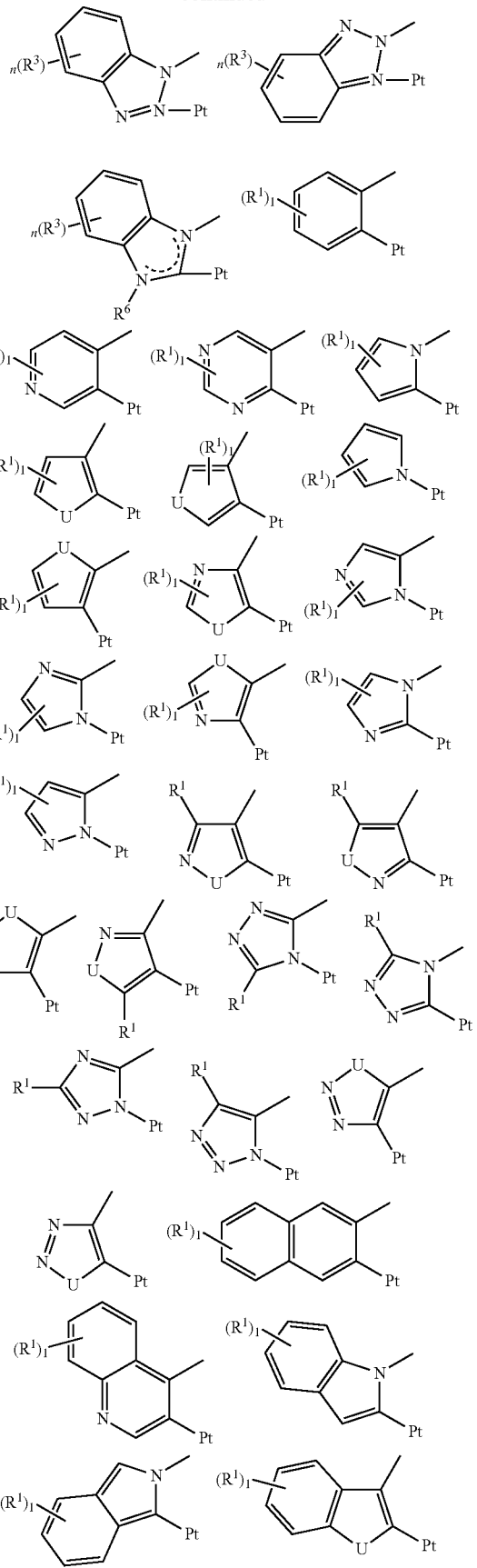

-continued
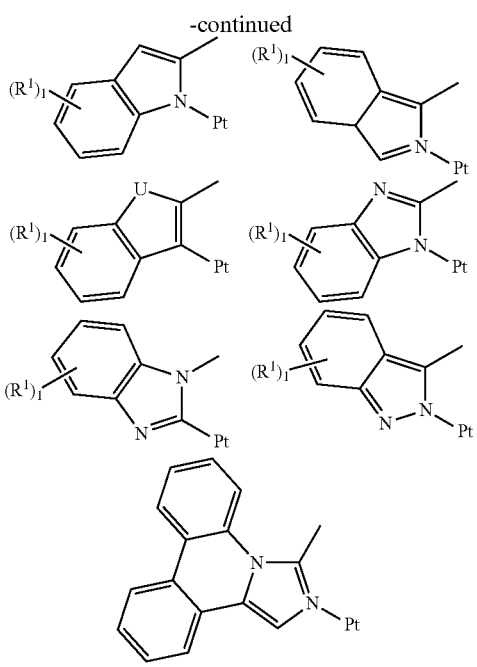
or a combination thereof.
In another aspect,
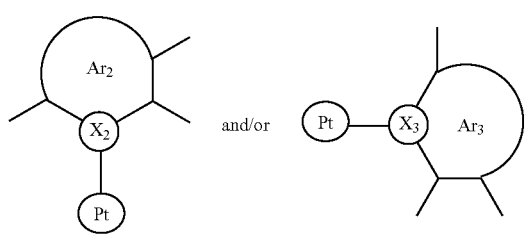
can each independently represent one or more of the following:
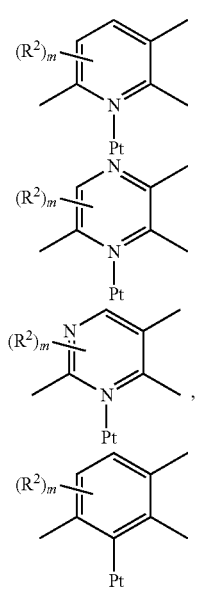
-continued
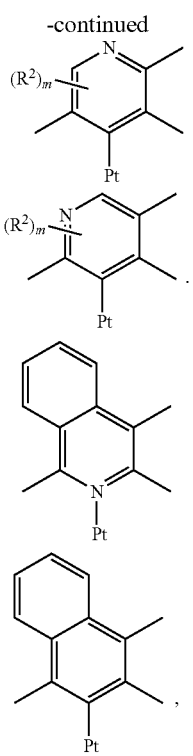
or a combination thereof.
In another aspect, each
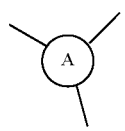
can independently represent one or more of the following:
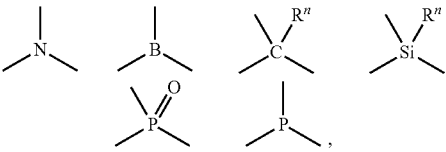
or a combination thereof.
In another aspect, each
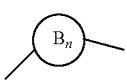
can independently represent one or more of the following:
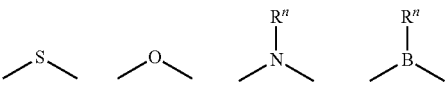

-continued
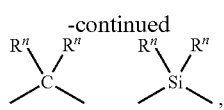
null or a combination thereof.
In another aspect,
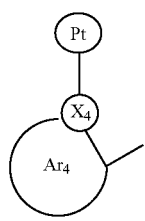
can represent one or more of the following:
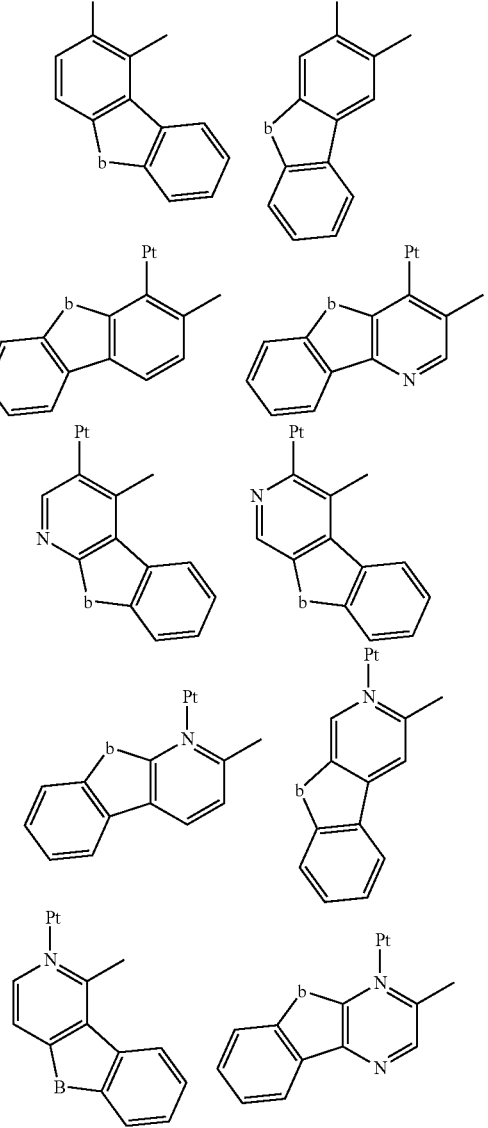
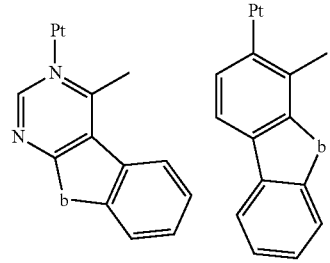
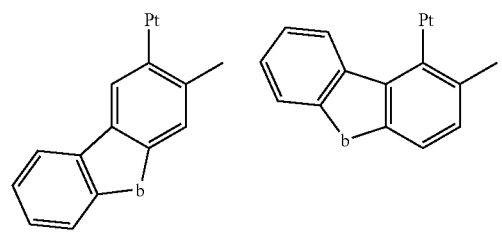
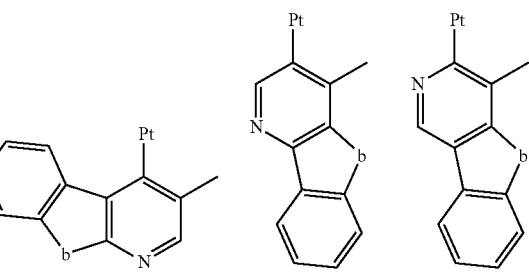
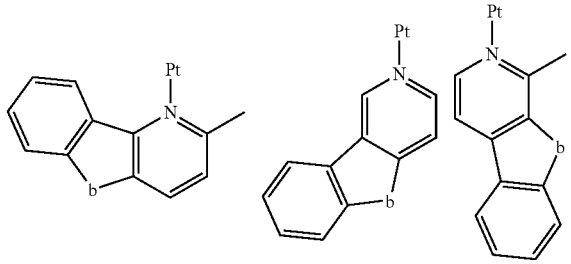
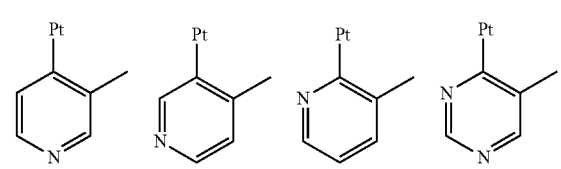
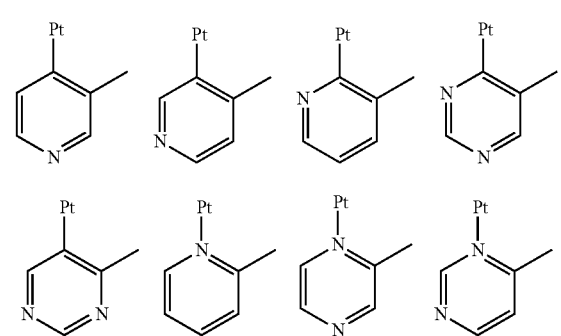

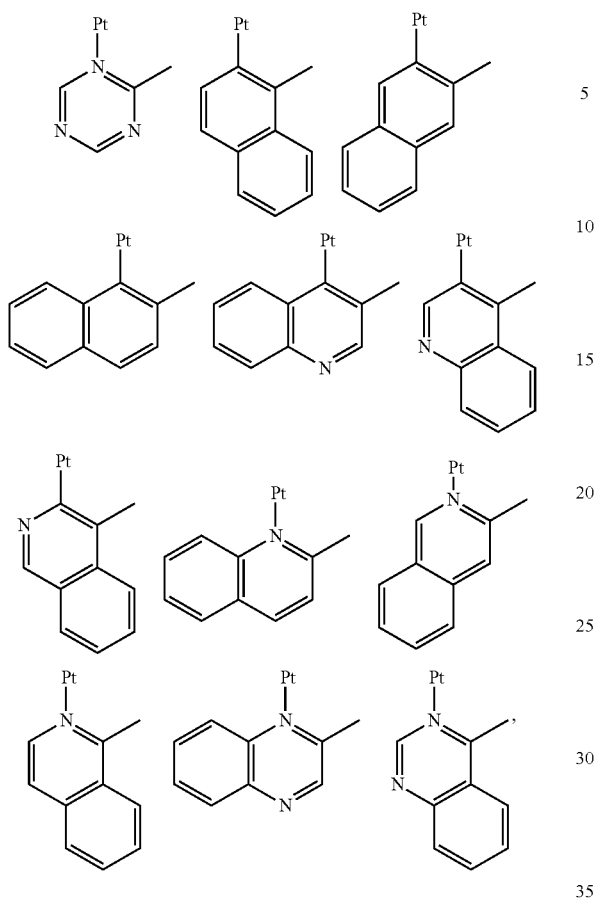
or a combination thereof.
In another aspect, each of
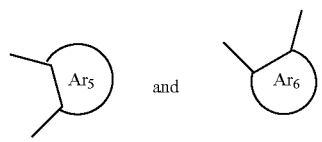
each represent one or more of the following:
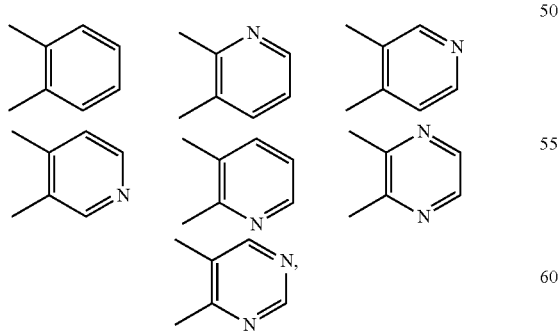
or a combination thereof.
In other aspects, the inventive composition can comprise any one or more of the following specific examples:
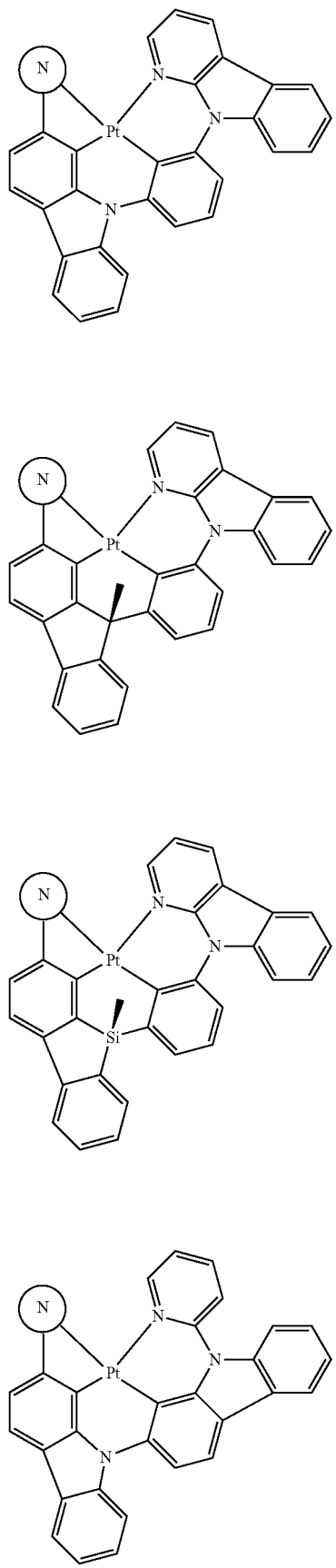

-continued

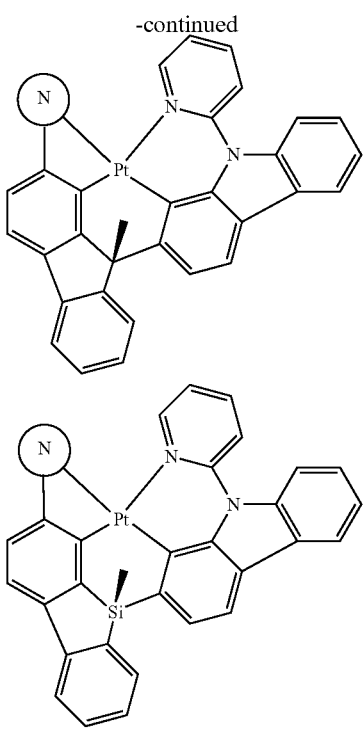

wherein

can be chosen from the following group

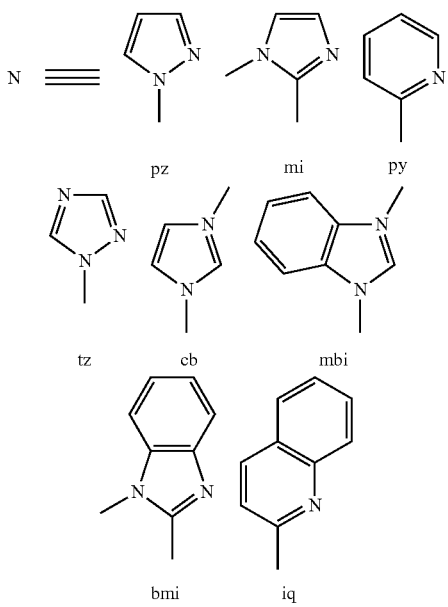

or a combination thereof.

In one aspect in the cavity device, the resonant wavelength is controlled by L, which can influence the shape and peak values of the EL spectra.

In one aspect control of L can be done by adjusting the thickness of the organic layers and/or the metallic light transmissive electrode. To obtain an optimum output spectrum, it is desirable to keep the cavity length at the peak of the free space emission wavelength.

In one aspect, the present invention provides a method for the fabrication of the microcavity narrow band OLED device that would result in a white OLED (WOLED) device with a color rendering index (CRI) of above 80 and with a power efficiency (PE) of 150 lm/W or more.

What is claimed is:

1. A microcavity narrow band organic light emitting diode (OLED) device having enhanced light emission, comprising,
   a) a substrate;
   b) a microcavity having a selected cavity length defined over one substrate by, in sequence, a dielectric mirror made with a quarter wave stack (QWS), a metallic transmissive electrode, an organic electroluminescent (EL) layer comprising of a hole injection layer (HIL), a hole transporting layer (HTL), an emissive layer (EML), an electron transporting layer (ETL), an electron injection layer (EIL), and a metal electrode,
   wherein the QWS comprises of a defined number of alternating high refractive index and low refractive index QWS pairs and wherein a maximum reflectivity of QWS mirrors is provided by selection of dielectric materials;
   wherein the metallic electrode layer is light transmissive and the metal electrode layer is substantially opaque and reflective;
   wherein the organic electroluminescent (EL) layer comprises at least one host material selected from the class of aryl amines and aryl-substituted carbazole compounds, aryl substituted oxadiazoles, aryl-substituted triazoles, aryl substituted phenanthrolines and metal quinoxolates and at least one phosphorescent emitter material dispersed in the at least one host material and selected from the class of phosphorescent dyes comprising derivatives of cyclometalated metal complexes having a narrow emission spectrum bandwidth, and wherein a full width at a half maximum emission intensity is less than 40 nm, so that one of red, green, or blue light is generated in the EML layer;
   wherein the position of the EML to the metal electrode layer that is opaque and reflective is defined;
   wherein the selected cavity length of the microcavity OLED device is tuned to provide a resonance condition for emission of one of red, green, or blue light through the light transmissive electrode layer and having the improved light extraction efficiency;
   wherein the light extraction efficiency of the device is tuned by adjusting the spacing between a metallic transmissive electrode and the metal electrode layer that is opaque and reflective, and the selected cavity length is modified by adjusting a thickness of the light transmissive electrode layer and a thickness of the organic electroluminescent layer (EL), or a combination thereof.

2. The microcavity narrow band OLED device according to claim 1, wherein the bottom metallic light transmissive electrode comprises of Indium Tin Oxide (ITO), zinc tin oxide (ZTO), tin oxide (SnOx), indium oxide (InOx), molybdenum oxide (MoOx), carbon nanotubes, and the thickness of the metallic light transmissive electrode is between 10 nm and 100 nm.

3. The microcavity narrow band OLED device according to claim 1, wherein the metal electrode layer that is opaque and reflective comprises of Al, Ag, Au or alloys thereof and the thickness of the metal electrode is between 20 nm to 300 nm.

4. The microcavity narrow band OLED device according to claim 1, wherein the metallic light transmissive electrode is an anode and the metal electrode that is opaque and reflective is a cathode.

5. The microcavity narrow band OLED device according to claim 1, wherein the alternating QWS pairs have a high index of refraction between 2 to 3.5, and a low index of refraction between 1 to 2.

6. The microcavity narrow band OLED device according to claim 1, wherein the QWS comprises the alternating high refractive index materials comprising TiO2, TaOx, amorphous Si or a combination thereof and the low refractive index materials comprising SiO2, SiNx, and LiF pairs or a combination thereof, the design wavelength is typically chosen to be close to the peak emission wavelength of an emissive material, such as narrow band phosphorescent emitters, or close to the emission wavelength at the desired temperature of operation of the device.

7. The microcavity narrow band OLED device according to claim 1, wherein the cavity length is defined as the spacing between the high refractive index material layer (the closest one to the metallic transmissive electrode layer) and the tap metal electrode layer that is opaque and reflective, wherein the cavity length is chosen to be equal or slightly longer than integer multiple of half-value of the peak emission wavelength of an emissive material, such as narrow band phosphorescent emitters, wherein the light extraction efficiency of the device is optimized.

8. The microcavity narrow band OLED device according to claim 1, wherein the light extraction efficiency of the device is tuned by adjusting a thickness of the light transmissive electrode layer and a thickness of the organic electroluminescent layer (EL), or a combination thereof.

9. The microcavity narrow band OLED device according to claim 1, wherein the phosphorescent emitter material comprises an emitter with full-width-half-maxim (FWHM) of emission spectra between 5-40 nm.

10. The microcavity narrow band OLED device according to claim 1, wherein a white OLED device can be fabricated by coating the opposite side of blue-emitting microcavity narrow band OLED device with green, yellow, orange and red phosphors, or a combination thereof.

11. The microcavity narrow band OLED device according to claim 7, wherein the cavity length is defined as the spacing between the high refractive index material layer (the closest one to the metallic transmissive electrode layer) and the metal electrode layer that is opaque and reflective, wherein the cavity length is chosen to be equal to or slightly longer than half-value of the peak emission wavelength of an emissive material, such as narrow band phosphorescent emitters, wherein the light extraction efficiency of the device is optimized.

12. The microcavity narrow band OLED device according to claim 7, wherein the cavity length is defined as the spacing between the high refractive index material layer (the closest one to the metallic transmissive electrode layer) and the metal electrode layer that is opaque and reflective, wherein the cavity length is chosen to be equal to or slightly longer than the peak emission wavelength of an emissive material, such as narrow band phosphorescent emitters, wherein the light extraction efficiency of the device is optimized.

13. The microcavity narrow band OLED device according to claim 9, wherein the composition of the phosphorescent emitter comprises of the general formula:

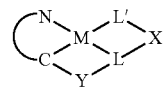

where (N^C) represents the emitting portion of the ligand, (LXL') represents an ancillary portion of the ligand, which may be linked, or not linked, M represents one or more of platinum, palladium, rhodium, iridium, silver, gold and copper, wherein Y represents a linking motif that connects (N^C) to (LXL') while disrupting the conjugation between them, wherein N can be chosen from the following group:

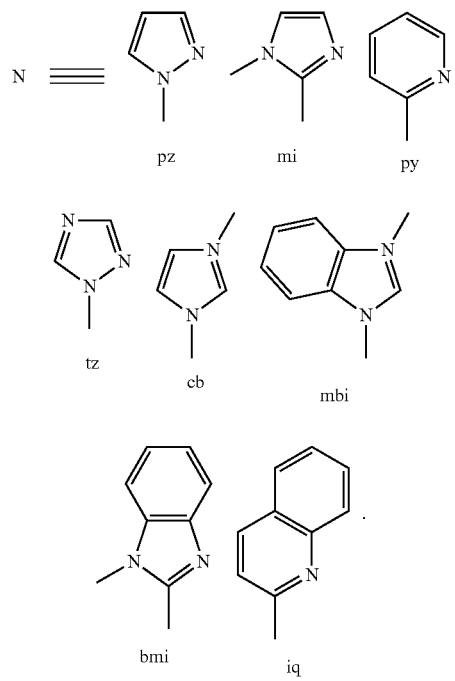

14. The microcavity narrow band OLED device according to claim 9, wherein the composition of the phosphorescent emitter comprises of one or more of the formulas:

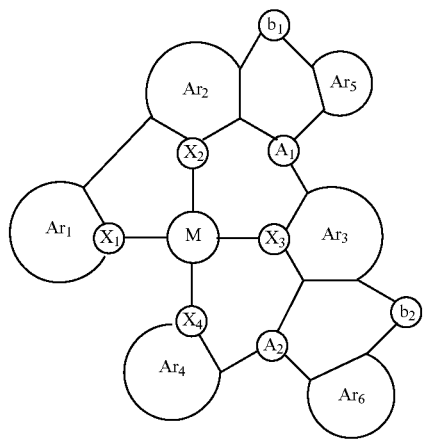

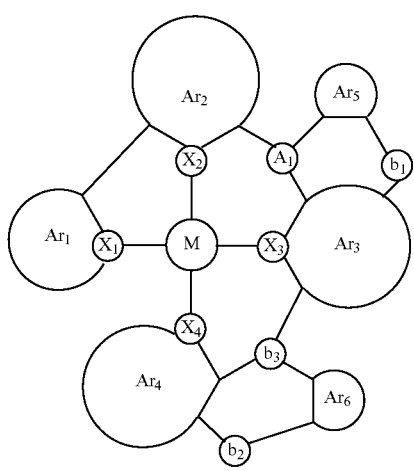

where each of Ar1, Ar2, Ar3, and Ar4, if present, independently represent an aromatic ring or heterocyclic group which can be substituted or unsubstituted; where each Xn can be coordinated to platinum, palladium, rhodium, iridium, silver, gold and copper, and can independently represent a carbon and/or a nitrogen atom, wherein Ar5 can represent an aromatic ring, a heterocyclic group, or a combination thereof, where Ar6 can represent an aromatic ring, a heterocyclic group, a combination thereof, or can be absent; where each An can independently represent a linking atom, such as, for example, nitrogen, carbon, boron, phosphorus, silicon, or a combination thereof, and wherein each An can optionally be substituted, where each bn can optionally be present or absent, and if present can independently represent oxygen, sulfur, nitrogen, carbon, boron, phosphorus, silicon, or a combination thereof, and wherein each bn can optionally be substituted.

15. The microcavity narrow band OLED device according to claim 13, wherein the phosphorescent emitter comprises one or more of the formulas:

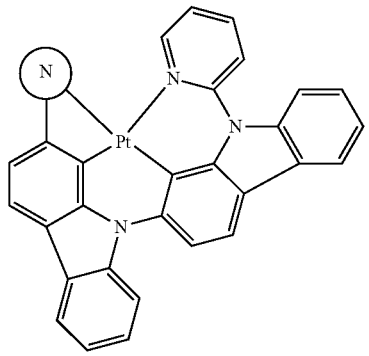

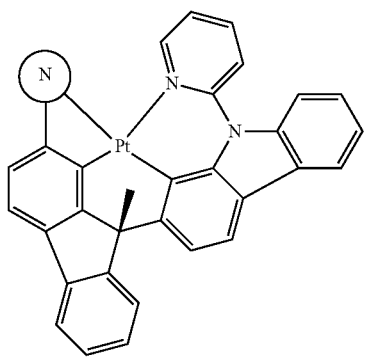

and wherein,

is one of the following

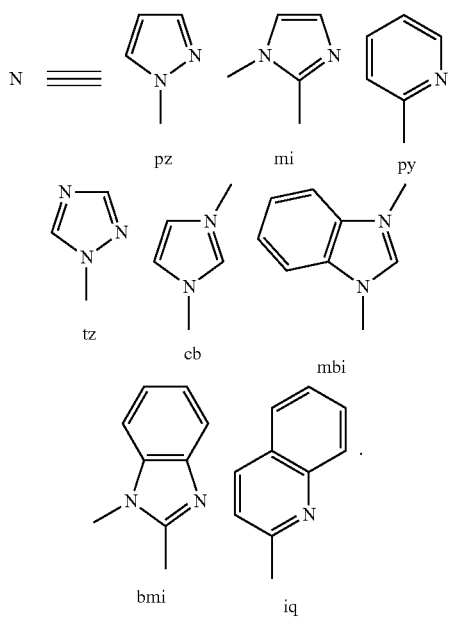

16. A microcavity narrow band organic light emitting diode (OLED) device having enhanced light emission, comprising, a) a substrate;
b) a microcavity having a selected cavity length defined over one substrate by, in sequence, a first metal electrode, an organic electroluminescent (EL) layer comprising of a hole injection layer (HIL), a hole transporting layer (HTL), an emissive layer (EML), an electron transporting layer (ETL), an electron injection layer (EIL), and a second metal electrode;
wherein one metal electrode layer is a metallic light transmissive electrode and the other metal electrode layer is substantially opaque and reflective;
wherein the organic electroluminescent layer comprises at least one host material selected from the class of aryl amines and aryl-substituted carbazole compounds, aryl substituted oxadiazoles, aryl-substituted triazoles, aryl substituted phenanthrolines and metal quinoxolates and at least one phosphorescent emitter material dispersed in the at least one host material and selected from the class of phosphorescent dyes comprising derivatives of cyclometalated metal complexes having a narrow emission spectrum bandwidth, and wherein a full width at a half maximum emission intensity is less than 40 nm, so that one of red, green, or blue light is generated in the EML layer;
wherein the position of the EML to the metal electrode layer that is opaque and reflective is defined;
wherein the selected cavity length of the microcavity OLED device is tuned to provide a resonance condition for emission of one of red, green, or blue light through the light transmissive electrode layer and having the improved light extraction efficiency;
wherein the light extraction efficiency of the device is tuned by adjusting the spacing between a metallic transmissive electrode and the metal electrode layer that is opaque and reflective, and the selected cavity length is modified by adjusting a thickness of the light transmissive electrode layer and a thickness of the organic electroluminescent layer (EL), or a combination thereof.

17. The microcavity narrow band OLED device according to claim 16, wherein the metallic light transmissive electrode comprises of Indium Tin Oxide (ITO), zinc tin oxide (ZTO), tin oxide (SnOx), indium oxide (InOx), molybdenum oxide (MoOx), carbon nanotubes, Al, Ag, Au or alloys thereof, and the thickness of the metallic light transmissive electrode is between 10 nm and 100 nm.

18. The microcavity narrow band OLED device according to claim 16, wherein the metal electrode layer that is opaque and reflective comprises of Al, Ag, Au or alloys thereof and the thickness of the metal electrode is between 50 nm to 300 nm.

19. The microcavity narrow band OLED device according to claim 16, wherein the bottom metallic electrode is light transmissive and the top metal electrode is opaque and reflective.

20. The microcavity narrow band OLED device according to claim 16, wherein the top metallic electrode is light transmissive and the bottom metal electrode is opaque and reflective.

21. The microcavity narrow band OLED device according to claim 16, wherein the cavity length is defined as the spacing between the metallic transmissive electrode layer and the metal electrode layer that is opaque and reflective, wherein the cavity length is chosen to be equal to or slightly longer than integer multiple of half-value of the peak emission wavelength of an emissive material, such as narrow band phosphorescent emitters, wherein the light extraction efficiency of the device is optimized.

22. The microcavity narrow band OLED device according to claim 16, wherein the light extraction efficiency of the device is tuned by adjusting a thickness of the light transmissive electrode layer, and a thickness of the organic electroluminescent layer (EL), or a combination thereof.

23. The microcavity narrow band OLED device according to claim 16, wherein the phosphorescent emitter material comprises an emitter with full-width-half-maxim (FWHM) of emission spectra between 5-40 nm.

24. The microcavity narrow band OLED device according to claim 21, wherein the cavity length is defined as the spacing between the metallic transmissive electrode layer and the metal electrode layer that is opaque and reflective, wherein the cavity length is chosen to be equal to or slightly longer than the half-value of the peak emission wavelength of an emissive material, such as narrow band phosphorescent emitters, wherein the light extraction efficiency of the device is optimized.

25. The microcavity narrow band OLED device according to claim 21, wherein the cavity length is defined as the spacing between the metallic transmissive electrode layer and the metal electrode layer that is opaque and reflective, wherein the cavity length is chosen to be equal to or slightly longer than the peak emission wavelength of an emissive material, such as narrow band phosphorescent emitters, wherein the light extraction efficiency of the device is optimized.

26. The microcavity narrow band OLED device according to claim 23, wherein the composition of the phosphorescent emitter comprises of the general formula:

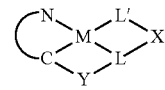

where (N^C) represents the emitting portion of the ligand, (LXL') represents an ancillary portion of the ligand, which may be linked, or not linked, M represents one or more of platinum, palladium, rhodium, iridium, silver, gold and copper, wherein Y represents a linking motif that connects (N^C) to (LXL') while disrupting the conjugation between them, wherein N can be chosen from the following group:

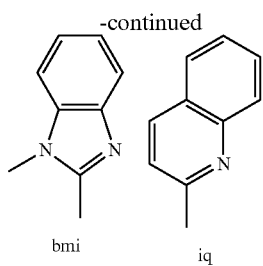

27. The microcavity narrow band OLED device according to claim 23, wherein the composition of the phosphorescent emitter comprises of one or more of the formulas:

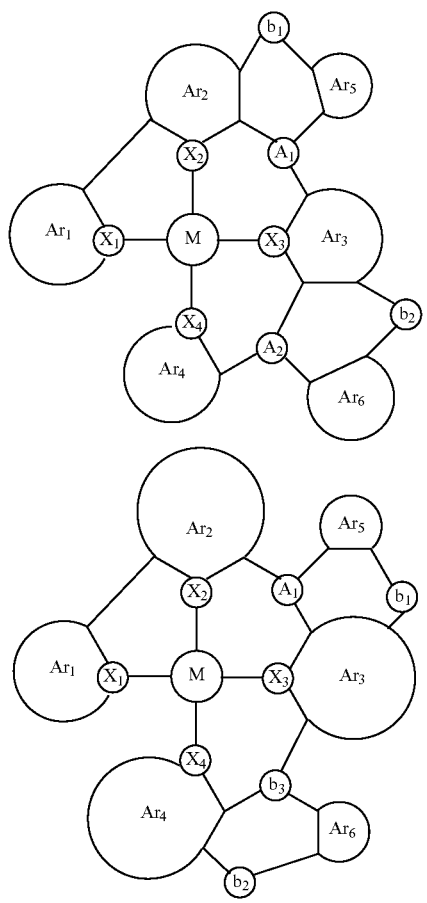

where each of Ar1, Ar2, Ar3, and Ar4, if present, independently represent an aromatic ring or heterocyclic group which can be substituted or unsubstituted; where each Xn can be coordinated to platinum, palladium, rhodium, iridium, silver, gold and copper, and can independently represent a carbon and/or a nitrogen atom, wherein Ar5 can represent an aromatic ring, a heterocyclic group, or a combination thereof, where Ar6 can represent an aromatic ring, a heterocyclic group, a combination thereof, or can be absent; where each An can independently represent a linking atom, such as, for example, nitrogen, carbon, boron, phosphorus, silicon, or a combination thereof, and wherein each An can optionally be substituted, where each bn can optionally be present or absent, and if present can independently represent oxygen, sulfur, nitrogen, carbon, boron, phosphorus, silicon, or a combination thereof, and wherein each bn can optionally be substituted.

28. The microcavity narrow band OLED device according to claim 26, wherein the phosphorescent emitter comprises one or more of the formulas:

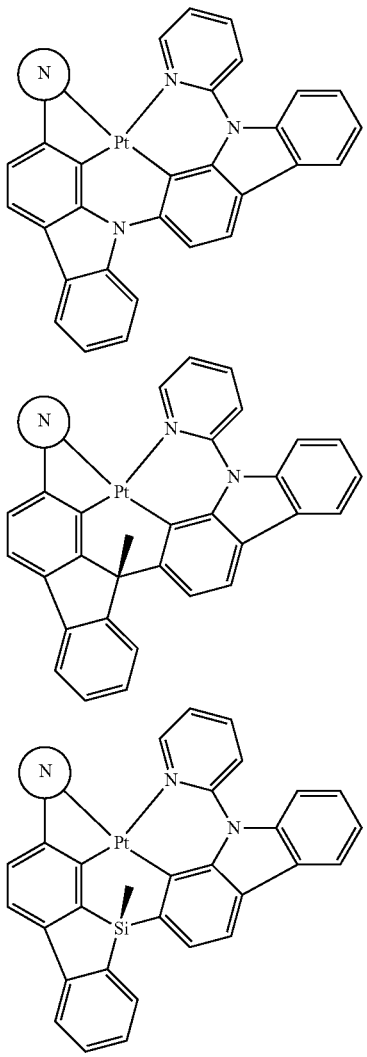

and wherein,

is one of the following

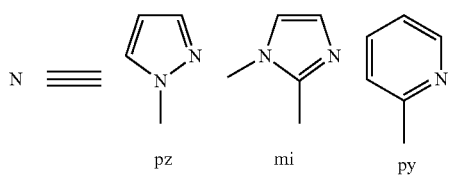

-continued
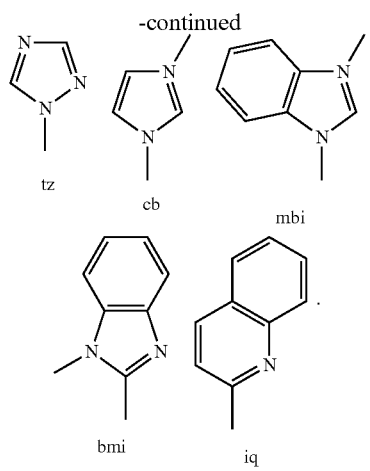
* * * * *